(12) United States Patent
Teipen et al.

(10) Patent No.: US 10,730,741 B2
(45) Date of Patent: Aug. 4, 2020

(54) MEMS SENSOR, ESPECIALLY PRESSURE SENSOR, FOR METROLOGICAL REGISTERING OF A MEASURED VARIABLE

(71) Applicant: Endress + Hauser GmbH + Co. KG, Maulburg (DE)

(72) Inventors: Rafael Teipen, Berlin (DE); Benjamin Lemke, Berlin (DE)

(73) Assignee: ENDRESS + HAUSER SE + CO.KG, Maulburg (DE)

( * ) Notice: Subject to any disclaimer, the term of this patent is extended or adjusted under 35 U.S.C. 154(b) by 291 days.

(21) Appl. No.: 15/556,070

(22) PCT Filed: Mar. 4, 2016

(86) PCT No.: PCT/EP2016/054657
§ 371 (c)(1),
(2) Date: Sep. 6, 2017

(87) PCT Pub. No.: WO2016/142291
PCT Pub. Date: Sep. 15, 2016

(65) Prior Publication Data
US 2018/0044166 A1  Feb. 15, 2018

(30) Foreign Application Priority Data
Mar. 10, 2015  (DE) .................. 10 2015 103 485

(51) Int. Cl.
*B81B 3/00* (2006.01)
*G01L 9/00* (2006.01)
(Continued)

(52) U.S. Cl.
CPC ........ *B81B 3/0072* (2013.01); *B81C 1/00531* (2013.01); *G01L 9/0048* (2013.01);
(Continued)

(58) Field of Classification Search
None
See application file for complete search history.

(56) References Cited

U.S. PATENT DOCUMENTS 3,625,058 A  12/1971  Dress et al.
5,056,369 A  10/1991  Tamai
(Continued)

FOREIGN PATENT DOCUMENTS

CN  87104354 A  1/1988
CN  101627292 A  1/2010
(Continued)

OTHER PUBLICATIONS

German Search Report, German Patent Office, Munich, DE, dated Oct. 23, 2015.
(Continued)

*Primary Examiner* — Natalie Huls
*Assistant Examiner* — Jermaine L Jenkins
(74) *Attorney, Agent, or Firm* — Bacon & Thomas, PLLC (57) ABSTRACT

A MEMS sensor with improved overload resistance for metrological registering of a measured variable comprises a plurality of layers, especially silicon layers, arranged on one another. The layers include at least one inner layer, which is arranged between a first layer and a second layer, and in the inner layer there is provided extending perpendicularly to the plane of the inner layer through the inner layer at least one cavity, on which borders externally at least sectionally and forming a connecting element, a region of the inner layer, which is connected with the first layer and the second layer. A lateral surface of the connecting element externally at least sectionally bordering the cavity has in an end region facing the first layer a rounding decreasing the cross sectional area of the cavity in the direction of the first layer, and has in an end region facing the second layer a rounding (Continued)

decreasing the cross sectional area of the cavity in the direction of the second layer.

13 Claims, 2 Drawing Sheets

(51) Int. Cl.
    *G01L 19/06*     (2006.01)
    *G01L 13/02*     (2006.01)
    *B81C 1/00*     (2006.01)

(52) U.S. Cl.
    CPC .......... *G01L 9/0073* (2013.01); *G01L 13/025* (2013.01); *G01L 19/0618* (2013.01); *B81B 2201/0264* (2013.01); *B81B 2203/0127* (2013.01); *B81B 2203/0315* (2013.01); *B81B 2203/04* (2013.01); *B81C 2201/0132* (2013.01)

(56) References Cited

U.S. PATENT DOCUMENTS

| | | | |
|---|---|---|---|
| 5,631,428 A | 5/1997 | Catanescu | |
| 6,601,452 B2 | 8/2003 | Murata | |
| 6,861,587 B1 | 3/2005 | Selvakumar | |
| 8,042,400 B2* | 10/2011 | Yoneda | G01L 9/0054 73/716 |
| 9,274,016 B2* | 3/2016 | Tokuda | G01L 13/025 |
| 9,360,387 B2* | 6/2016 | Tokuda | G01L 9/0042 |
| 9,442,033 B2* | 9/2016 | Getman | G01L 9/0073 |
| 10,067,024 B2* | 9/2018 | Jochem | G01L 19/0618 |
| 2002/0014124 A1 | 2/2002 | Drewes | |
| 2014/0137652 A1* | 5/2014 | Tokuda | G01L 13/025 73/715 |
| 2017/0176276 A1* | 6/2017 | Tokuda | G01L 9/0054 |
| 2018/0044166 A1 | 2/2018 | Teipen | |
| 2018/0275001 A1* | 9/2018 | Tokuda | G01L 9/06 |

FOREIGN PATENT DOCUMENTS

| | | |
|---|---|---|
| CN | 101939627 A | 1/2011 |
| CN | 103837287 A | 6/2014 |
| DE | 4011734 A1 | 10/1990 |
| DE | 10126621 A1 | 12/2001 |
| DE | 102006040345 A1 | 3/2008 |
| DE | 102008035017 A1 | 1/2010 |
| DE | 10393943 B3 | 6/2012 |
| DE | 102012109587 A | 4/2014 |
| DE | 102015103485 A1 | 9/2016 |
| EP | 0 949 489 A1 | 10/1999 |
| EP | 1705489 A2 | 9/2006 |
| EP | 2 209 110 A1 | 7/2010 |
| EP | 2 801 799 A1 | 11/2014 |
| WO | 2004057291 A1 | 7/2004 |

OTHER PUBLICATIONS

International Search Report, EPO, The Netherlands, dated May 13, 2016.
English Translation of the International Preliminary Report on Patentability, WIPO, Geneva, CH, dated Sep. 21, 2017.
European Office Action issued in corresponding European Application No. 16 704 246.4, dated Jun. 25, 2019.
Chinese Office Action in corresponding Chinese Application No. 201680014763.9, dated Jan. 31, 2019.
Office Action issued in corresponding International Appln. No. 201680014763.9 dated Feb. 10, 2020.

* cited by examiner

MEMS SENSOR, ESPECIALLY PRESSURE SENSOR, FOR METROLOGICAL REGISTERING OF A MEASURED VARIABLE

TECHNICAL FIELD

The present invention relates to a MEMS sensor for metrological registering of a measured variable, which sensor comprises a plurality of layers, especially silicon layers, arranged on one another, wherein the layers include at least one inner layer, which is arranged between a first layer and a second layer, and in the inner layer there is provided extending perpendicularly to the plane of the inner layer through the inner layer at least one cavity, on which borders externally, at least sectionally, and forming a connecting element, a region of the inner layer, which is connected with the first layer and the second layer.

BACKGROUND DISCUSSION

MEMS sensors are micro-electromechanical systems, which are applied for metrological registering of a measured variable, e.g. a pressure, a mass- or a volume flow, a density, a viscosity, a temperature, a pH-value or an electrical conductivity.

MEMS sensors are regularly constructed of layers, especially silicon layers, arranged on one another, and by applying methods usual in semiconductor technology, such as e.g. etching processes, oxidation methods, implantation methods, bonding methods and/or coating methods. In such case, the individual layers, as well as, in given cases, connecting layers, e.g. insulation layers, provided between adjoining layers, are prepared, and structured, corresponding to the functions assigned to them in the sensor.

MEMS sensors regularly comprise components, which can be exposed to a mechanical load. An example, in such case, are functional elements of electromechanical transducers integrated in the MEMS sensor. The functional elements are exposed to a mechanical load dependent on the measured variable to be registered. The mechanical load is converted by the transducer into an electrical variable dependent on the measured variable.

Mechanical loads bring about unavoidable stresses, which mechanically affect individual sensor components and/or components connected with individual sensor components. This is not a problem as long as the loads do not exceed a load limit, frequently referred to as the overload resistance, predetermined for the sensor. As a practical matter, however, sensors are continually being exposed to overloads.

The danger of overloading is especially great in the case of pressure difference sensors, which are applied for measuring pressure differences $\Delta p$ between two pressures $p_1$, $p_2$ large in comparison to the pressure difference $\Delta p$. Since these sensors must be sensitive enough metrologically to register the pressure difference $\Delta p$ superimposed on the system pressure corresponding to the smaller of the two pressures, a problem arises, above all, in the case of unilateral overloads, when only one side of a measuring membrane of the pressure difference sensor is supplied with a high pressure, and there is no counterpressure acting on the oppositely lying side of the measuring membrane.

In such case, sensors, which have regions with well-developed edges, are especially sensitive to mechanical loading, since abrupt edges lead to stress concentrations, which in the case overloading can bring about stress cracking or even stress fractures.

An example of this involves piezoresistive pressure sensors, which have a measuring membrane loadable with a pressure to be measured. These pressure sensors are regularly produced, in which case a cavity is etched into a silicon wafer by means of an anisotropic etching method, e.g. an anisotropic etching method performed with potassium hydroxide (KOH). In such case, an edge of the sensor chip surrounding the cavity forms a carrier, which surrounds the measuring membrane exposed by the cavity. However, anisotropic etching methods produce abrupt edges at the transition between the measuring membrane and the carrier, where stress concentrations occur.

For solving this problem, German Patent, DE 10 2008 035 017 A1 describes producing the measuring membrane exposing cavity by means of a combination of anisotropic and isotropic etching methods. In such case, there is produced with the anisotropic etching method a cavity, which tapers conically for increasing the mechanical stability in the direction of the measuring membrane. Then, in a following, isotropic etching procedure, the abrupt edges arising in the anisotropic etching are rounded at the transition with the measuring membrane. The rounded edges reduce stress concentrations.

An alternative form of embodiment of a piezoresistive pressure sensor is described in German Patent, DE 10 2007 010 913 A1. This has two layers of silicon, which are connected with one another via a connecting layer, namely an oxide layer, arranged between the two layers. In the case of this pressure sensor, piezoresistive elements are provided on one of the layers and the second layer has a cavity, via which a region of the first layer forming the measuring membrane and the oxide layer connected therewith are exposed. In order to be able metrologically to register also small pressures with a small linearity error, a groove is provided in the oxide layer on the side of the measuring membrane lying opposite the piezoresistive elements and serves to concentrate the stresses produced by the pressure acting on the measuring membrane at the locations, where the piezoresistive elements are located. For increasing the strength of the sensor, the groove has a rounded cross-sectional geometry, and the cavity in the second layer has preferably a lateral surface conically tapering in the direction of the oxide layer.

The combination of a stability increasing, conically tapering cavity with a rounded transition effected e.g. by a rounded groove or a rounded edge assumes, however, that sufficient space is available for a conically tapering and therewith unavoidably bigger cavity on its open side, and that the rounded edge is accessible in measure sufficient for using an isotropic etching method.

Both assumptions are fulfillable, when the cavity is located in an outer layer, thus an outer layer accessible from outside of the MEMS sensor.

The stress concentrations limiting overload resistance of MEMS sensors can, however, also occur at locations in the interior of the sensors, locations which are not directly externally accessible. This situation is present in the case of MEMS sensors, which have a cavity enclosed in the interior of the sensor, where at least one portion borders a layer, which, in given cases, can be exposed to mechanical loadings. An example of this is in pressure sensors with a pressure chamber enclosed under a measuring membrane contactable with a pressure. A further example is formed by furrows, e.g. an isolation moat, extending through an inner layer of a sensor and surrounding a portion of the inner layer connected with one of the two outer layers and spaced from the other. There are also MEMS sensors, e.g. capacitive pressure sensors, in the case of which the aforementioned examples occur in combination with one another.

German Patent, DE 103 93 943 B3 describes a pressure difference sensor, which has a plurality of layers, especially silicon layers, arranged on one another, wherein the layers include at least one inner layer, which is arranged between a first layer and a second layer, and there is provided in its inner layer at least one cavity extending perpendicularly to the plane of the inner layer, through the inner layer, on which cavity there borders externally at least sectionally a region of the inner layer forming a connecting element and connecting the first layer and the second layer.

The pressure difference sensor includes a first layer surrounding a measuring membrane and arranged between two platforms. Each platform is connected with the first layer to enclose a pressure chamber, and includes an inner layer and a second layer connected therewith via a connecting layer. The inner layers are divided by a cavity embodied as an isolation moat into an outer region forming the connecting element and an inner region externally surrounded on all sides by the connecting element. The inner regions serve as electrodes and are, in each case, spaced from the measuring membrane by a cavity in the inner layer connected with the isolation moat. Each electrode forms together with the first layer serving as counterelectrode a capacitor with a capacitance dependent on the pressure acting on the measuring membrane.

In order to configure MEMS sensors as small and as stably as possible, it is important to keep cavities in the interior of MEMS sensors small. Toward this end, cavities in inner layers of MEMS sensors are preferably externally limited by lateral surfaces, which extend essentially perpendicularly to the first and second layers. This leads to essentially right angled transitions from the connecting element to the first layer and from the connecting element to the second layer. Correspondingly, forces acting on the first layer, the second layer and/or the connecting element in the transitional regions lead to stress concentrations, which limit the overload resistance of the sensor.

SUMMARY OF THE INVENTION

It is an object of the present invention to provide a MEMS sensor having a cavity enclosed in the sensor and having an improved overload resistance.

For this, the invention resides in a MEMS sensor for metrological registering of a measured variable, comprising
a plurality of layers, especially silicon layers, arranged on one another,
wherein the layers include at least one inner layer, which is arranged between a first layer and a second layer, and
in the inner layer there is provided extending perpendicularly to the plane of the inner layer through the inner layer at least one cavity, on which borders externally, at least sectionally, and forming a connecting element, a region of the inner layer, which is connected with the first layer and the second layer, and
characterized in that a lateral surface of the connecting element externally bordering the cavity
has in an end region facing the first layer a rounding decreasing the cross sectional area of the cavity in the direction of the first layer, and
has in an end region facing the second layer a rounding decreasing the cross sectional area of the cavity in the direction of the second layer.

To this end, the invention resides in a MEMS sensor for metrological registering of a measured variable, comprising
a plurality of layers, especially silicon layers, arranged on one another,
wherein the layers include at least one inner layer, which is arranged between a first layer and a second layer, and
in the inner layer there is provided extending perpendicularly to the plane of the inner layer through the inner layer at least one annular cavity, on which borders externally and forming a connecting element, a region of the inner layer, which is connected with the first layer and the second layer, and which annularly surrounds the cavity, wherein the connecting element (9) in the region of the inner layer is isolated completely from a region surrounded by the cavity, characterized in that a lateral surface of the connecting element at least sectionally externally bordering the cavity
has in an end region facing the first layer a rounding decreasing the cross sectional area of the cavity in the direction of the first layer, and
has in an end region facing the second layer a rounding decreasing the cross sectional area of the cavity in the direction of the second layer.

A first further development is distinguished by features including that
at least one inner layer has, surrounded by the cavity, at least one additional region, which is connected with the first layer or the second layer,
at least one inner layer has, connected with the first layer or the second layer, at least one additional region, which borders on a cavity extending perpendicularly to the inner layer through the inner layer, and,
at least sectionally internally bordering the cavity, a lateral surface of the additional region, in which lateral surface, the end region facing the layer connected with the additional region has a rounding decreasing the cross sectional area of the cavity in the direction of the layer connected with the additional region.

An embodiment of the invention provides that layers adjoining one another are connected either directly with one another or via a connecting layer, especially an insulation layer, especially of silicon dioxide, provided between the two adjoining layers.

A preferred embodiment of the latter embodiment provides that
the connecting layers have a layer thickness small in comparison with the layer thickness of the layers adjoining one another, especially a layer thickness in the order of magnitude of one or more micrometers, especially a layer thickness of 1 µm to 5 µm, especially 2 µm to 4 µm,
wherein the layers adjoining one another have especially a layer thickness of greater than or equal to several 10 s of µm.

Another embodiment of the invention provides that the connecting element surrounds the cavity externally on all sides.

Another embodiment of the invention provides that the inner layer includes at least one additional region, especially an additional region serving as an electrode, especially an additional region surrounded by an isolation moat, especially an isolation moat formed by the cavity.

A preferred embodiment of MEMS sensors of the invention provides that
the MEMS sensor is a pressure sensor, especially an absolute pressure-, a relative pressure- or a pressure difference sensor, the first layer comprises a measuring membrane, and the first layer is connected with a platform to enclose a pressure chamber, and the platform comprises the inner layer and the second layer.

The first layer has preferably a symmetry plane extending perpendicular to the deflection direction of the measuring membrane, and the first layer is symmetric to the symmetry plane, when the measuring membrane is located in the resting position.

A further development of the latter preferred embodiment provides that the inner layer is connected with the first layer via a first connecting layer, and the first connecting layer has a cavity exposing the measuring membrane and forming a pressure chamber.

An embodiment of the preferred embodiment or its further development provides that the inner layer includes at least one additional region serving as an electrode, especially an additional region surrounded by an isolation moat, especially an isolation moat formed by the cavity, the inner layer is connected with the second layer via a second connecting layer embodied as an insulation layer, the electrode is connected with the second layer via the second connecting layer, and the electrode is spaced from the first layer serving as a counterelectrode thereto.

An embodiment of the MEMS sensors of the invention formed as pressure sensor provides that the platform has, extending through the platform, a passageway, which communicates with the pressure chamber.

Another embodiment of the latter embodiment of the MEMS sensors of the invention formed as a pressure sensor provides that on a side of the first layer lying opposite the platform a further platform, especially an equally constructed further platform, is provided, which is connected with the first layer to enclose a pressure chamber.

As already above mentioned, the first layer has preferably a symmetry plane extending perpendicular to the deflection direction of the measuring membrane and the first layer is symmetric to the symmetry plane, when the measuring membrane is located in the resting position; a pressure sensor of the invention with two platforms serves especially as a pressure difference sensor, wherein here preferably the entire construction of the pressure sensor with the two platforms, at least as regards the mechanically determining components, is symmetric to the symmetry plane.

In a further development of the invention, the rounded end regions have a radius of curvature selected as a function of the layer thickness of the inner layer, wherein the radius of curvature is greater than or equal to 1 µm, especially greater than or equal to 5 µm, especially greater than or equal to 10 µm.

Additionally, the invention resides in a method for manufacture of a MEMS sensor of the invention, characterized in that the cavity is produced by a combination of an anisotropic etching method and an isotropic etching method.

A further development of the method is characterized in that by means of an anisotropic etching method, especially by means of deep reactive ion etching (DRIE), a furrow, especially a furrow with side walls extending essentially perpendicularly to the inner layer, is produced in the inner layer, wherein the furrow extends to a predetermined etching depth into the inner layer but does not completely pierce it, and by means of an isotropic etching method, especially by means of reactive ion etching (RIE), the cavity extending through the inner layer is produced from the furrow.

A further development of the latter further development is characterized in that the etching depth is predetermined as a function of a layer thickness of the inner layer in such a manner that a difference between the layer thickness of the inner layer and the etching depth corresponds to a radius of curvature of the rounded end regions to be produced.

BRIEF DESCRIPTION OF THE DRAWINGS

The invention and its advantages will now be explained in greater detail based on the figures of the drawing showing an example of an embodiment. Equal elements are provided in the figures with equal reference characters. The figures of the drawing show as follows.

DETAILED DISCUSSION IN CONJUNCTION WITH THE DRAWINGS

Figure 1:
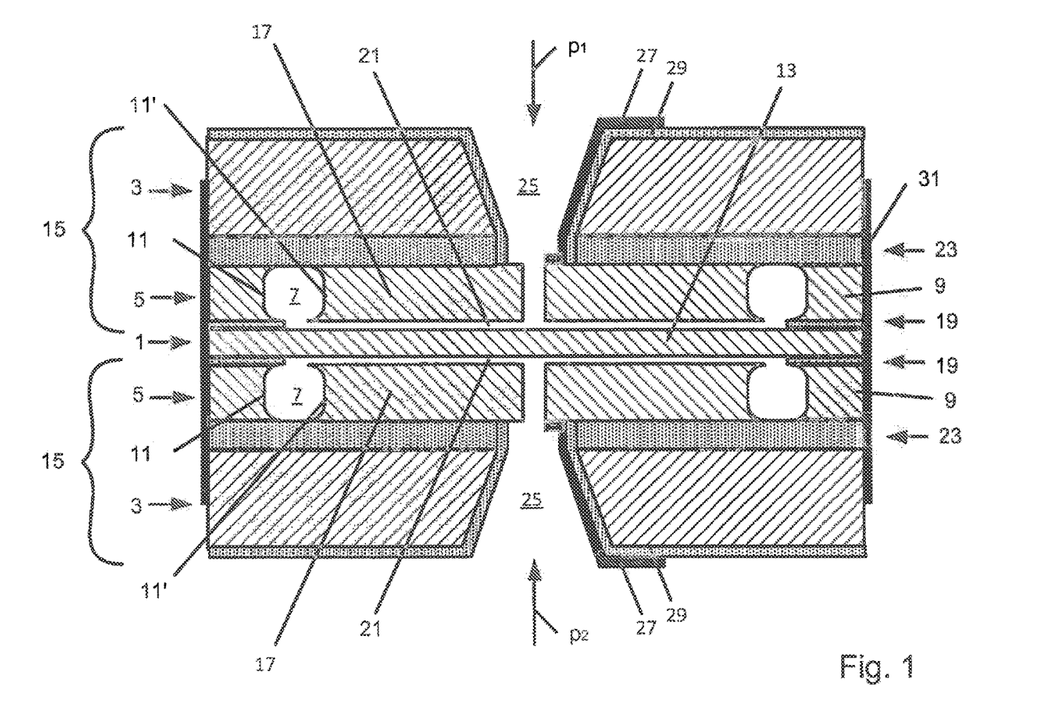
FIG. 1 is a MEMS sensor of the invention.

FIG. 1 shows an example of an embodiment of a MEMS sensor of the invention. In order to make recognizable also components with partially very different construction size, FIG. 1 is not to scale. This illustrated example of an embodiment concerns a pressure difference sensor. The invention is, however, not limited to pressure sensors, but, instead, can also be applied in the case of other MEMS sensors for metrological registering of a measured variable, which sensors comprise a plurality of layers 1, 3, 5, especially silicon layers, arranged on one another, of which at least one is an inner layer 5, which is arranged between a first layer 1 and a second layer 3, and in which at least one cavity 7 is provided extending perpendicularly to the plane of the inner layer 5 through the inner layer 5, on which cavity there borders externally at least sectionally a region of the inner layer 5 forming a connecting element 9, which is connected with the first layer 1 and the second layer 3.

According to the invention, the overload resistance of these MEMS sensors is increased by features including that a lateral surface 11 of the connecting element 9 at least sectionally externally bordering the cavity 7 has in an end region facing the first layer 1 a rounding decreasing the cross sectional area of the cavity 7 in the direction of the first layer 1, and has in an end region facing the second layer 3 a rounding decreasing the cross sectional area of the cavity 7 in the direction of the second layer 3. These terminally located roundings provide a soft transition from the connecting element 9 to the first layer 1 and from the connecting element 9 to the second layer 3. In this way, stress concentrations are markedly reduced, so that the MEMS sensors of the invention can withstand significantly higher loads. They have, thus, a higher overload resistance.

If at least one inner layer 5 of the MEMS sensor comprises at least one additional region connected with the adjoining first layer 1 or with the adjoining second layer 3, which additional region borders on a cavity 7 extending perpendicularly to this inner layer 5 through this inner layer 5, then also a lateral surface 11' of this additional region at least sectionally internally bordering this cavity 7 has preferably in its end region facing the layer 1, 3 connected with the additional region a rounding decreasing the cross sectional area of the cavity 7 in the direction of the layer 1,3 connected with the additional region.

The larger a radius of curvature of the rounded end regions, the more strongly stress concentrations are reduced. In such case, the radius of curvature can be made greater, the larger the layer thickness of the inner layer 5 and the more space available for the cavity 7. The end regions have, depending on layer thickness and available space preferably each a radius of curvature of greater than or equal to 1 µm, preferably greater than or equal to 5 µm, and especially preferably greater than or equal to 10 µm.

The first layer 1 of the pressure difference sensor illustrated in FIG. 1 includes a region serving as measuring membrane 13. The first layer 1 is arranged between two platforms 15 and connected with each of the two platform 15 to form two pressure chambers.

Each platform 15 includes an inner layer 5 and a second layer 3. Provided in the inner layers 5 of the platforms 15 is, in each case, a cavity 7 extending through the inner layer 5. The cavities 7 form annular moats, which subdivide the inner layer 5 into a region surrounded by the isolation moat and forming an electrode 17 and an outer region surrounding the cavity 7 externally on all sides. In the example of an embodiment shown here, each platform 15 has only one electrode 17. It is, however, directly possible to equip platform 15 with two or more electrodes, e.g. by providing in the inner layer 5 additional isolation moats, which divide the region surrounded by the outer region of the inner layer 5 into correspondingly many portions usable as electrodes.

The outer regions form, in each case, a connecting element 9 arranged between the first layer 1 and the second layer 3 and connected with the first layer 1 and the second layer 3. According to the invention, the connecting elements 9 have, in each case, externally bordering the particular cavity 7 a lateral surface 11, which has in an end region facing the first layer 1 a rounding decreasing the cross sectional area of the cavity 7 in the direction of the first layer 1, and in an end region facing the second layer 3 a rounding decreasing the cross sectional area of the cavity 7 in the direction of the second layer 3.

In the case of MEMS sensors of the invention, the individual layers 1,3, 5 can, depending on the type of the sensor and the function of the individual layers 1, 3, 5, in each case, be connected with one another either directly or via, provided between two adjoining layers, a connecting layer 19, 23, e.g. an insulation layer, e.g. of silicon dioxide. The connecting layers 19, 23 have in comparison with the layer thickness of the layers 1, 3, 5 a small layer thickness.

Thus, the layers 1, 3, 5 have, depending on function, regularly, layer thicknesses greater than or equal to one or more 10 s of µm, frequently even in the order of magnitude of one or more 100 s of µm, e.g. from 100 µm to 400 µm. In the case of the pressure difference sensor illustrated in FIG. 1, the second layers 3 serving as support layers have preferably layer thicknesses in the order of magnitude of one or more 100 s of µm, e.g. 200 µm. In contrast, the inner layers 5 can have smaller layer thicknesses, e.g. layer thicknesses in the order of magnitude from 40 µm to 50 µm. The first layer 1 comprising the measuring membrane 13 has, predetermined as a function of the measuring range of the pressure sensor, a layer thickness, which, depending on measuring range, lies e.g. in the order of magnitude of one or more 10 s of µm.

In contrast, the connecting layers 19, 23 have preferably a layer thickness in the order of magnitude of one or more micrometers, e.g. from 1 µm to 5 µm, especially 2 µm to 4 µm.

In the illustrated example of an embodiment, the inner layers 5 of the two platforms 15 are connected with the first layer 1, in each case, via a first connecting layer 19, preferably an insulation layer, e.g. of silicon dioxide. The first connecting layers 19 have, in each case, serving as pressure chamber, a cavity 21, which exposes the total region of the first layer 1 serving as measuring membrane 13. The cavities 21 are dimensioned in such a manner that the cavities 7 in the inner layers 5 each communicate with the adjoining cavity 21. Due to the cavities 21, the electrodes 17 integrated in the platforms 15 are spaced from the measuring membrane 13 and the measuring membrane 13 is deflectable in the two opposing directions perpendicular to the first layer 1. For this, depending on pressure measuring range and thickness of the measuring membrane 13, a layer thickness of the first connecting layers 19 of one or a few micrometers, e.g. 2 µm, is sufficient. This form of embodiment offers the advantage that the layer thickness of the first connecting layers 19 and therewith also the electrode separation between the respective electrode 17 and the first layer 1 serving as counterelectrode given thereby can be predetermined extremely precisely.

A separation between electrode 17 and measuring membrane 13 can alternatively also be achieved without using a first connecting layer 19, in that the electrodes 17 connected with the second layers 3 have, in each case, a layer thickness, which is less than the layer thickness of the connecting elements 9. This variant is provided in the case of the pressure sensor described in DE 103 93 943 B3.

Each of the electrodes 17 forms, adjoining the cavity 7 in its platform 15, an additional region of the inner layer 5, which has a lateral surface 11' at least sectionally internally bordering the cavity 7. Correspondingly, also the lateral surfaces 11' of the electrodes 17 bounding the cavity 7 have preferably, at least in their end regions facing the second layer 3 connected therewith, a rounding decreasing the cross sectional area of the cavity 7 in the direction of the second layer 3.

For electrical insulation of the electrodes 17 from the second layer 3 of the relevant platform 15, the inner layers 5 are, in each case, connected with the adjoining second layer 3 via a second connecting layer 23 embodied as an insulation layer, e.g. a layer of silicon dioxide. For reducing parasitic capacitances, the second connecting layers 23 have preferably a layer thickness of a number of micrometers, e.g. in the order of magnitude of 4 µm.

Both platforms 15 have, extending through them, passageway's 25, which extend from the exterior through the second layer 3, the second connecting layer 23 and the electrode 17, and into the cavity 21 in the first connecting layer 19 exposing the measuring membrane 13. In measurement operation, the side of the measuring membrane 13 facing the one platform 15 is supplied via its passageway 25 with a first pressure $p_1$, and the side of the measuring membrane 13 facing the other platform 15 is supplied via its passageway 25 with a second pressure $p_2$. This leads to a deflection of the measuring membrane 13 dependent on the pressure difference $\Delta p$ acting on the measuring membrane 13.

Each of the two electrodes 17 forms together with the first layer 1 serving as counterelectrode a capacitor with a capacitance dependent on the pressure dependent deflection of the measuring membrane 13. For metrological registering of the pressure difference $\Delta p$ to be measured, at least one of the two capacitances is registered by means of a measurement circuit (not shown) connected thereto, and converted into a signal dependent on the pressure difference Δp. Such signal is then available for display and/or for additional evaluation and/or processing.

Electrical connection of the electrodes 17 occurs e.g. via electrode terminals 27 provided on their platforms 15, which extend from a region of the side of the electrode 17 facing away from the measuring membrane 13 and exposed via the passageway 25 in the particular platform 15 along a lateral surface of the passageway 25 out to a connection region provided on a side of the respective second layer 3 facing away from the measuring membrane 13. Preferably, the electrode connections 27 are electrically insulated from the second layer 3 of the particular platform 15, e.g. in that an insulation layer 29 is provided between the lateral surfaces of the second layers 3, over which the electrode connections 27 extend, and the particular electrode terminal 27.

The electrical connection of the measuring membrane 13 can occur e.g. via a membrane connection 31, e.g. a metallized one, applied on the outer lateral surface of the MEMS sensor, such as is described e.g. in DE 103 93 943 B3.

Other membrane connection techniques known to those skilled in the art are naturally likewise applicable. Thus, e.g. at least one of the two platforms 15 can be equipped with a membrane connection (not shown), which extends along a lateral surface of a cavity provided on the outer edge of the platform 15 up to an edge region of the first layer 1 exposed through the cavity, where it is electrically conductively connected with the exposed edge region of the first layer 1.

If the pressure difference sensor is subjected to a unilateral pressure loading, in the case of which the measuring membrane 13 is upwardly deflected in FIG. 1, then the greatest stresses occur in the transitional region from the connecting element 9 of the lower platform 15 to the first layer 1. In the case of a unilateral pressure loading, in the case of which the measuring membrane 13 is deflected downwards in FIG. 1, the greatest stresses occur in the transitional region from the connecting element 9 of the upper platform 15 to the first layer 1. In both cases, the rounded end regions of the lateral surfaces 11 of the connecting elements 9 provided on the corresponding transitional regions act to reduce stress concentrations, so that the transition regions are exposed to only markedly smaller loads distributed more uniformly over the respective transitional region. The same holds naturally analogously also in the case of a bilateral load, such as e.g. occurs, when the measuring membrane 13 is exposed to a pressure difference Δp superimposed on a very high system pressure. In the case of such a bilateral load, the greatest stresses occur in the transitional region between the connecting element 9 of the upper platform 15 and the second layer 3 of the upper platform 15 and in the transitional region between the connecting element 9 of the smaller platform 15 and the second layer 3 of the lower platform 15. In such case, the rounded end regions of the lateral surfaces 11 of the connecting elements 9 provided in the corresponding transitional regions act also here to reduce stress concentrations. Sensors of the invention have, thus, a higher overload resistance.

Figure 2:
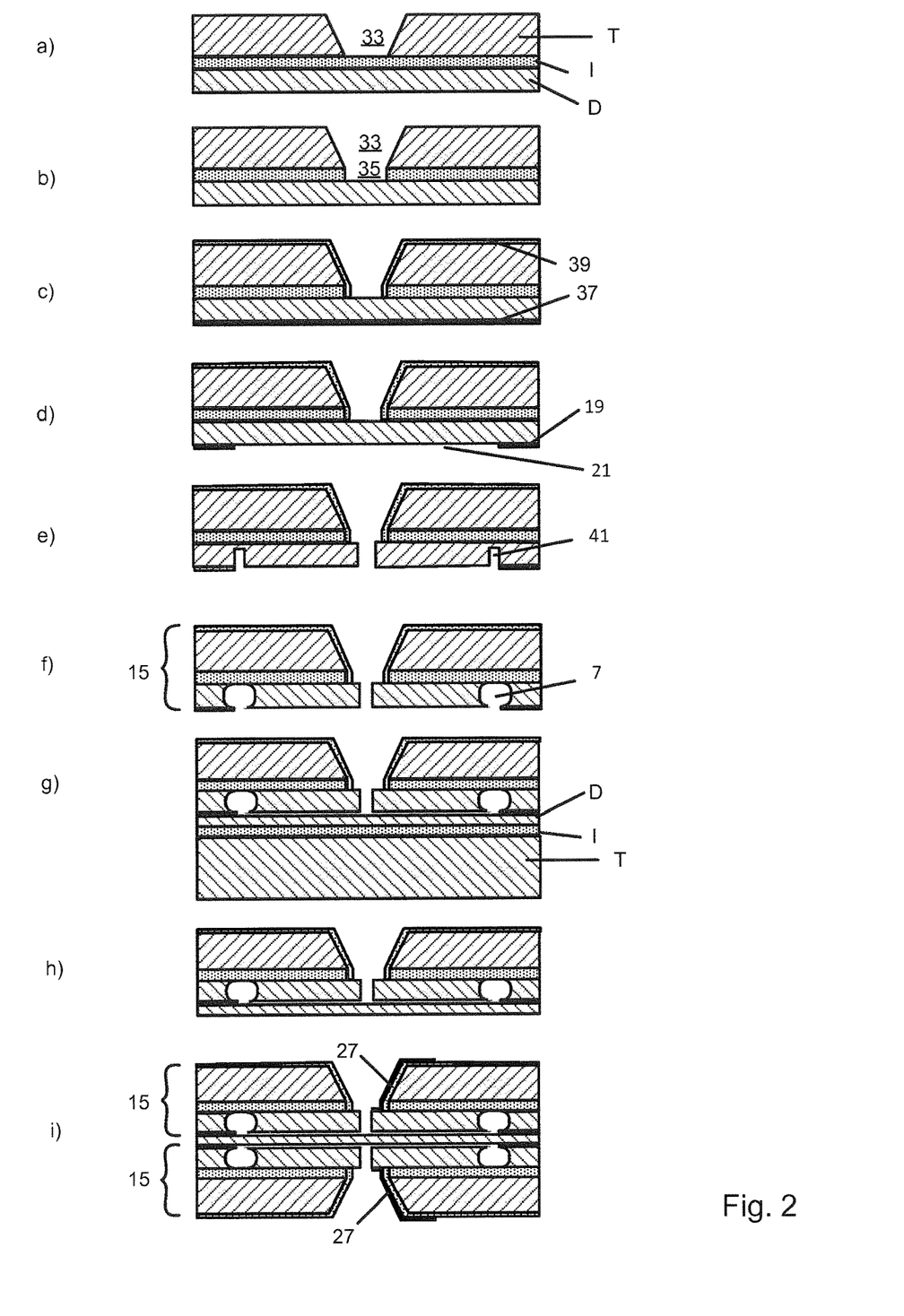
FIG. 2 is method steps for manufacture of the MEMS sensor of FIG. 1.

Additionally, the invention includes a method executable on an undivided wafer for manufacturing MEMS sensors of the invention. This method will now be explained using the example of the pressure difference sensor illustrated in FIG. 1. Thus, FIG. 2 shows the individual intermediate products produced in the method steps a)-i). Preferably used for manufacturing the sensors are 3 SOI wafers, which are each composed of an electrically conductive, support layer T of silicon, an insulation layer I of silicon dioxide arranged thereon, and an electrically conductive cover layer D of silicon arranged on the insulation layer I. In such case, a first set of platforms 15 is produced from a first SOI wafer on one undivided wafer, wherein from the support layer T the second layers 3 are manufactured, from the cover layer D the inner layers 5, and from its insulation layer I the second connecting layers 23.

In method step a), produced in the support layer T are the portions 33 the passageways 25 of the platforms 15 extending through the second layers 3. For this, pits forming the portions 33 can be etched into the support layer T at the appropriate locations in an etching method executed e.g. with potassium hydroxide (KOH).

In the following method step b), the portions 35 of the passageways 25 of the platform 15 extending through the second connecting layers 23 are produced in the insulation layer I. Used for this is a suitable etching method, such as e.g. reactive ion etching (RIE), for the selective removal of silicon oxide.

In the following method step c), insulation layers 37, 39 are produced on the upper- and undersides of the wafer, except for the surfaces required for the electrically conductive connections of the electrode connections 27 to the electrodes 17. For this, a wet oxidation method can be applied, for example, with which a silicon oxide layer is created on the corresponding surfaces.

In the following method step d), the first connecting layers 19 are manufactured from the insulation layer 37 applied on the cover layer D, in that the cavities 21 are produced in the insulation layer 37. A dry etching method can be applied for this, for example.

Following this, the cavities 7 are produced in the inner layers 5. In such case, for producing the lateral surfaces 11, 11' with terminal rounding respectively externally and internally bounding the cavity 7, preferably a combination of an anisotropic etching method and an isotropic etching method is used.

Figure 3:
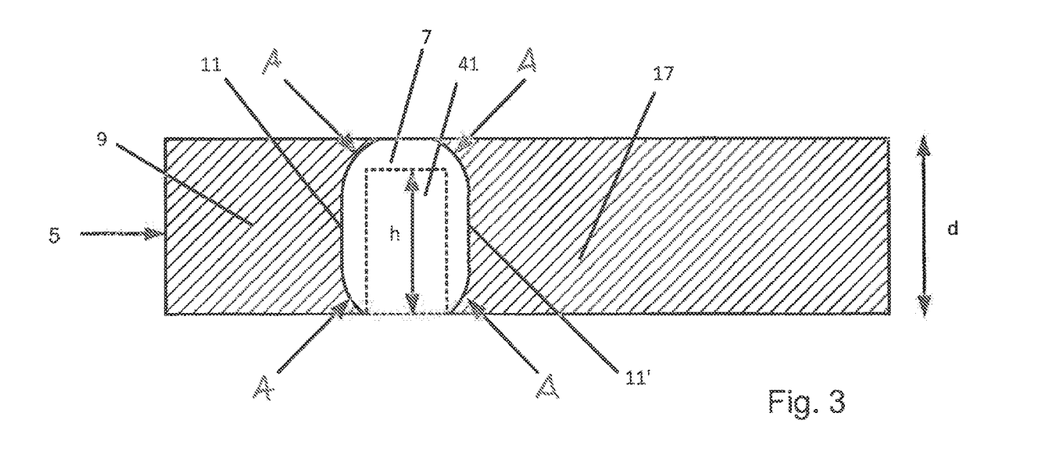
FIG. 3 is an enlarged illustration of the method steps e) and f) of FIG. 2.

For this, preferably procedure is such that in a first method step e) furrows 41 are produced in the cover layer D forming the inner layers 5 by means of an anisotropic etching method. The furrows 41 extend essentially perpendicularly to the plane of the cover layer D into the cover layer D to a predetermined etching depth h, but do not completely pierce the cover layer D, i.e. do not go all the way through the cover layer D. For this, an anisotropic etching method, e.g. a deep reactive ion etching method (DRIE), can be applied, in the case of which, between etching steps following one another, in each case, a passivating layer, e.g. a polymer layer, e.g. of octafluorocyclobutane ($C_4F_8$), is applied on the inner surfaces of the moat segments etched in to that point in time. The etching steps are executed e.g. by means of a high energy high-frequency plasma, which is produced e.g. from sulfur hexafluoride ($SF_6$) introduced in a carrier gas, e.g. argon. During the etching, a chemical etching reaction occurs based on sulfur hexafluoride radicals ($SF_6$), upon which is superimposed a physical material removal by argon ions accelerated in an electrical field. While the chemical etching reaction is essentially isotropic, the physical material removal exhibits an anisotropy dependent on the ion direction of attack and the ion energy. The directional dependence of the physical material removal has the result that the passivating layers applied between the etching steps are removed faster on the floors of the moat segments than on their side walls, so that the sidewalls are protected from further material removal by the chemical etching process. By the alternating sequence of etch- and passivating steps, furrows 41 arise with side walls extending essentially perpendicularly to the inner layer 5. FIG. 3 shows, for this, an enlarged representation of the cavity 7 in the inner layer 5, wherein a rectangular furrow 41 produced in method step e) is shown dashed in cross section.

Following the anisotropic etching of the furrows 41, the passivating layers are removed, and the cavities 7 completed in method step f). For this, an isotropic etching method, such as e.g. reactive ion etching (RIE), is applied. This differs from deep reactive ion etching (DRIE) described in method step e) essentially by the features that no passivating layers are applied, and the physical material removal is kept as small as possible, so that the isotropic chemical reaction dominates the etching process.

The isotropic etching method enlarges the furrows 41 in all directions, whereby the lateral surfaces 11, 11' of the connecting element 9 and the electrode 17 externally bounding the resulting cavities 7 obtain rounding in their end region facing the first layer 1 and in their end region facing the second layer 3, as brought out in FIG. 3 by the arrows directed thereon. In such case, the radius of curvature of the rounded end regions can, within certain limits, be predetermined via a stated specification of the etching depth h of the furrows 41 in the inner layer 5 in relation to the layer thickness d of the inner layer 5. To this end, the anisotropic etching is executed to an etching depth h, such that the difference between the layer thickness d of the inner layer 5 and the etching depth h corresponds to the radius of curvature to be produced.

Then, in method step g), a second SOI wafer is connected, e.g. by bonding, with the first wafer processed according to the method steps a)-f) in such a manner that the cover layer D of the second wafer lies on the first connecting layers 19 produced on the cover layer D of the first wafer. Then, in method step h), the support layer T and the insulation layer I of the second SOI wafer are removed. Suited for removal of the support layer T are etching methods, such as e.g. reactive ion etching (RIE). Suited for removing the insulation layer I are, for example, wet chemical etching methods, such as e.g. etching methods executed with hydrofluoric acid (HF). The remaining cover layer D of the second wafer forms the first layers 1 of the pressure difference sensors comprising the measuring membranes 13.

In parallel with performing the method steps a)-f) or following thereon, a further set of platforms 15 is manufactured from a third SOI wafer. For this, the above described methods can be applied.

Then in method step i), the platforms 15 produced from the undivided third wafer are connected, e.g. by bonding, in such a manner with the composite from step h) that the platforms 15, 15 lie pairwise oppositely on both sides of the measuring membranes 13. Additionally, the electrode connections 27 are applied, e.g. as sputter deposited metal coatings, on the corresponding lateral surfaces. Then, the pressure difference sensors manufactured in this way are separated by sawing along the outer lateral surfaces of the individual pressure difference sensors and the membrane connections 31 applied, e.g. as sputter deposited metal coatings.

The invention can be applied completely analogously in connection with variations of the pressure sensors illustrated here. An example are pressure difference sensors, which differ from the example of an embodiment illustrated here in that only one of the two platforms has an electrode, in that at least one of the two platform has two or more electrodes, or in that the cavity has a pressure chamber, whose height is less than or equal to the layer thickness of the inner layer. A further example is relative pressure sensors, which have only one platform, which is connected with a first layer comprising the measuring membrane enclosing a pressure chamber. In that case, absent is the second platform 15 provided in the described pressure difference sensors. In the case of relative pressure sensors, the outside of the measuring membrane 13 is supplied with the pressure p to be measured, while on its inner side there bears a reference pressure supplied to the pressure chamber via the passageway 25 in the platform 15. Completely analogously to these relative pressure sensors, naturally also absolute pressure sensors can be constructed by evacuating the pressure chamber of the described relative pressure sensors. In that case, absent is the passageway leading through the platform 15 into the pressure chamber, wherein the electrode integrated in the platform can be electrically contacted e.g. through a duct in the platform leading to its electrode rear side facing away from the measuring membrane.

Moreover, the invention can naturally also be applied completely analogously in other MEMS sensors for metrological registering of pressures or other measured variables, where at least one inner layer is arranged between a first layer and a second layer, through which there extends at least one cavity, which is bounded externally at least sectionally by at least one connecting element connected with the first layer and the second layer.

LIST OF REFERENCE CHARACTERS 1 first layer
3 second layer
5 inner layer
7 cavity
9 connecting element
11 lateral surface
13 measuring membrane
15 platform
17 electrode
19 first connecting layer
21 cavity
23 second connecting layer
25 passageway
27 electrode terminal
29 insulation layer
31 membrane connection
33 portion of the passageway 25
35 portion of the passageway 25
37 insulation layer
39 insulation layer
41 furrow

The invention claimed is:

1. A MEMS sensor for metrological registering of a measured variable, comprising:
a plurality of layers arranged on one another, wherein:
said plurality of layers include at least one inner layer, which is arranged between a first layer and a second layer, and
in said inner layer there is provided extending perpendicularly to the plane of said inner layer through said inner layer at least one annular cavity, on which borders externally and forming a connecting element, a region of said inner layer, which is connected with said first layer and said second layer, and which surrounds said cavity annularly; said connecting element in the region of said inner layer is isolated by said cavity completely from an additional region surrounded by said cavity; and
a lateral surface of said connecting element externally bordering said cavity has in an end region facing said first layer a rounding decreasing the cross sectional area of said cavity in the direction of said first layer, and has in an end region facing said second layer a rounding decreasing the cross sectional area of said cavity in the direction of said second layer;
wherein layers adjoining one another are connected either directly with one another or via a connecting layer provided between the two adjoining layers, and
wherein said connecting layers have a layer thickness small in comparison with the layer thickness of the layers adjoining one another, and the layers adjoining one another have especially a layer thickness of greater than or equal to several 10s of μm.

2. A MEMS sensor as claimed in claim 1, wherein:
at least said one inner layer has, surrounded by said cavity, at least one additional region, which is connected with said first layer or said second layer, and which borders on said cavity extending perpendicularly to said one inner layer through said one inner layer; and
said at least one additional region has a lateral surface at least sectionally internally bordering said cavity, in which lateral surface the end region facing the layer connected with said at least one additional region has a rounding decreasing the cross sectional area of said cavity in the direction of the layer connected with said at least one additional region.

3. The MEMS sensor as claimed in claim 1, wherein:
said connecting element surrounds said cavity externally on all sides.

4. The MEMS sensor as claimed in claim 1, wherein:
said inner layer includes at least one additional region, especially an additional region serving as an electrode.

5. The MEMS sensor as claimed in claim 1, wherein:
the MEMS sensor is a pressure sensor, especially an absolute pressure, a relative pressure or a pressure difference sensor;
said first layer comprises a measuring membrane; and
said first layer is connected with a platform to enclose a pressure chamber, and said platform comprises said inner layer and said second layer.

6. The MEMS sensor as claimed in claim 5, wherein:
said inner layer is connected with said first layer via a first connecting layer; and
said first connecting layer has a cavity exposing said measuring membrane and forming a pressure chamber.

7. The MEMS sensor as claimed in claim 5, wherein:
said inner layer includes at least one additional region serving as an electrode, especially an additional region surrounded by an isolation moat;
said inner layer is connected with said second layer via a second connecting layer embodied as an insulation layer;
said electrode is connected with said second layer via said second connecting layer; and
said electrode is spaced from said first layer serving as a counterelectrode thereto.

8. The MEMS sensor as claimed in claim 5, wherein:
said platform has, extending through said platform, a passageway, which communicates with the pressure chamber.

9. The MEMS sensor as claimed in claim 5, wherein:
on a side of said first layer lying opposite said platform a further platform, especially an equally constructed further platform, is provided, which is connected with said first layer to enclose a pressure chamber.

10. The MEMS sensor as claimed in claim 1, wherein:
the rounded end regions have, selected as a function of the layer thickness of said inner layer, a radius of curvature, which is greater than or equal to 1 μm, especially greater than or equal to 5 μm, especially greater than or equal to 10 μm.

11. A method for manufacture of a MEMS sensor as claimed in claim 1, wherein said cavity is produced by a combination of an anisotropic etching method and an isotropic etching method.

12. The method as claimed in claim 11, wherein:
by means of an anisotropic etching method especially by means of deep reactive ion etching (DRIE), a furrow with side walls extending essentially perpendicularly to the inner layer, is produced in the inner layer, the furrow extends to a predetermined etching depth into the inner layer but does not completely pierce it; and
by means of an isotropic etching method, especially by means of reactive ion etching (RIE), the cavity extending through the inner layer is produced from the furrow.

13. The method as claimed in claim 12, wherein:
the etching depth is predetermined as a function of a layer thickness of the inner layer in such a manner that a difference between the layer thickness of the inner layer and the etching depth corresponds to a radius of curvature of the rounded end regions to be produced.

* * * * *